United States Patent
Su et al.

(10) Patent No.: US 8,779,859 B2
(45) Date of Patent: Jul. 15, 2014

(54) MULTI-CASCODE AMPLIFIER BIAS TECHNIQUES

(75) Inventors: Wenjun Su, San Diego, CA (US); Chiewcharn Narathong, Laguna Niguel, CA (US); Guangming Yin, Newport Coast, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/570,062

(22) Filed: Aug. 8, 2012

(65) Prior Publication Data

US 2014/0043102 A1 Feb. 13, 2014

(51) Int. Cl.
*H03F 1/22* (2006.01)

(52) U.S. Cl.
USPC .......................................... 330/311

(58) Field of Classification Search
USPC ............................ 330/296, 311, 51
See application file for complete search history.

(56) References Cited

U.S. PATENT DOCUMENTS

| | | | |
|---|---|---|---|
| 6,137,367 A | 10/2000 | Ezzedine et al. | |
| 6,977,552 B2 | 12/2005 | Macedo | |
| 7,248,120 B2* | 7/2007 | Burgener et al. | 330/311 |
| 7,786,807 B1* | 8/2010 | Li et al. | 330/311 |
| 8,014,719 B2 | 9/2011 | Moloudi et al. | |
| 8,111,104 B2* | 2/2012 | Ahadian et al. | 330/290 |
| 8,130,035 B2 | 3/2012 | Weigandt et al. | |
| 8,131,251 B2* | 3/2012 | Burgener et al. | 455/333 |
| 8,150,343 B2 | 4/2012 | Ramachandra Reddy | |
| 8,350,624 B2* | 1/2013 | Lam | 330/261 |
| 8,427,241 B2* | 4/2013 | Ezzeddine et al. | 330/311 |
| 8,487,706 B2* | 7/2013 | Li et al. | 330/311 |
| 2006/0119435 A1 | 6/2006 | Oh et al. | |
| 2010/0141337 A1 | 6/2010 | Chen | |

FOREIGN PATENT DOCUMENTS

| | | |
|---|---|---|
| DE | 2243297 A1 | 6/1973 |
| JP | 2007135097 A | 5/2007 |

OTHER PUBLICATIONS

Araki et al., "A 0.13 μm CMOS 90 dB variable gain pre-power amplifier using robust linear-in-dB attenuator," IEEE Radio Frequency Integrated Circuits Symposium, RFIC Jun. 2008, pp. 673-676.

Jung, et al., "Ultra-wideband low noise amplifier using a cascade feedback topology," Microwave and Optical Tech. Letters, Jun. 2006, pp. 1102-1104, vol. 48, No. 6.

(Continued)

*Primary Examiner* — Khanh V Nguyen
(74) *Attorney, Agent, or Firm* — Ramin Mobarhan

(57) ABSTRACT

Techniques for generating bias voltages for a multi-cascode amplifier. In an aspect, a multi-cascode bias network is provided, each transistor in the bias network being a replica of a corresponding transistor in the multi-cascode amplifier, enabling accurate biasing of the transistors in the multi-cascode amplifier. In another aspect, a voltage supply for the multi-cascode amplifier is provided separately from a voltage supply for the replica bias network, to advantageously decouple variations in the amplifier voltage supply from the bias network voltage supply. In yet another aspect, the bias voltages of transistors in the multi-cascode amplifier may be configured by adjusting the impedance of resistive voltage dividers coupled to the transistor gate biases. As the gain of the amplifier depends on the bias voltages of the cascode amplifiers, the gain of the amplifier may be adjusted in this manner without introducing a variable gain element directly in the amplifier signal path.

19 Claims, 6 Drawing Sheets

(56) References Cited

OTHER PUBLICATIONS

Pornpromlikit, et al., "A Watt-Level Stacked-FET Linear Power Amplifier in Silicon-on-Insulator CMOS," IEEE Transactions on Microwave Theory and Techniques, Jan. 2010, pp. 57-64; vol. 58, No. 1.

Scuderi a, et al., "A VSWR-Protected Silicon Bipolar RF Power Amplifiers with Soft-Slope Power Control", IEEE JSSC, vol. 40, No. 3, Mar. 2005, pp. 611-621.

International Search Report and Written Opinion—PCT/US2013/054187—ISA/EPO—Nov. 12, 2013.

* cited by examiner

MULTI-CASCODE AMPLIFIER BIAS TECHNIQUES

BACKGROUND

1. Field

The disclosure relates to integrated circuit design, and, in particular, to techniques for designing amplifiers having a multi-cascode configuration.

2. Background

In the design of CMOS RF power amplifiers (PA's), a multi-cascode circuit topology may be adopted, wherein multiple cascode transistors are provided at the drain of an input transistor. To generate bias voltages for the multi-cascode circuit, a resistive divider from a supply voltage to ground may be tapped and provided to the gates of the multiple cascode transistors, while a separate network may be used to bias the input transistor. One shortcoming of this solution is that the mapping between the bias voltages generated thereby and the desired currents in the devices may not be accurate, as the configuration of the bias networks of the input transistor is different from that of the cascode amplifier circuit.

In a further aspect of amplifier design, a variable attenuation element may be coupled in series with the PA to provide the PA with variable gain. To adjust the power of the PA output, the attenuation provided by the attenuation element may be adjusted. A disadvantage of this approach is that the attenuation element needs to be provided directly in the signal path of the PA, and may thus undesirably contribute to noise in the PA output, and also vary both the input and output impedances of the PA.

It would be desirable to provide accurate and efficient techniques for biasing a multi-cascode amplifier circuit, and further to provide variable gain to such a multi-cascode amplifier circuit without necessarily introducing a series attenuation element into the signal path.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
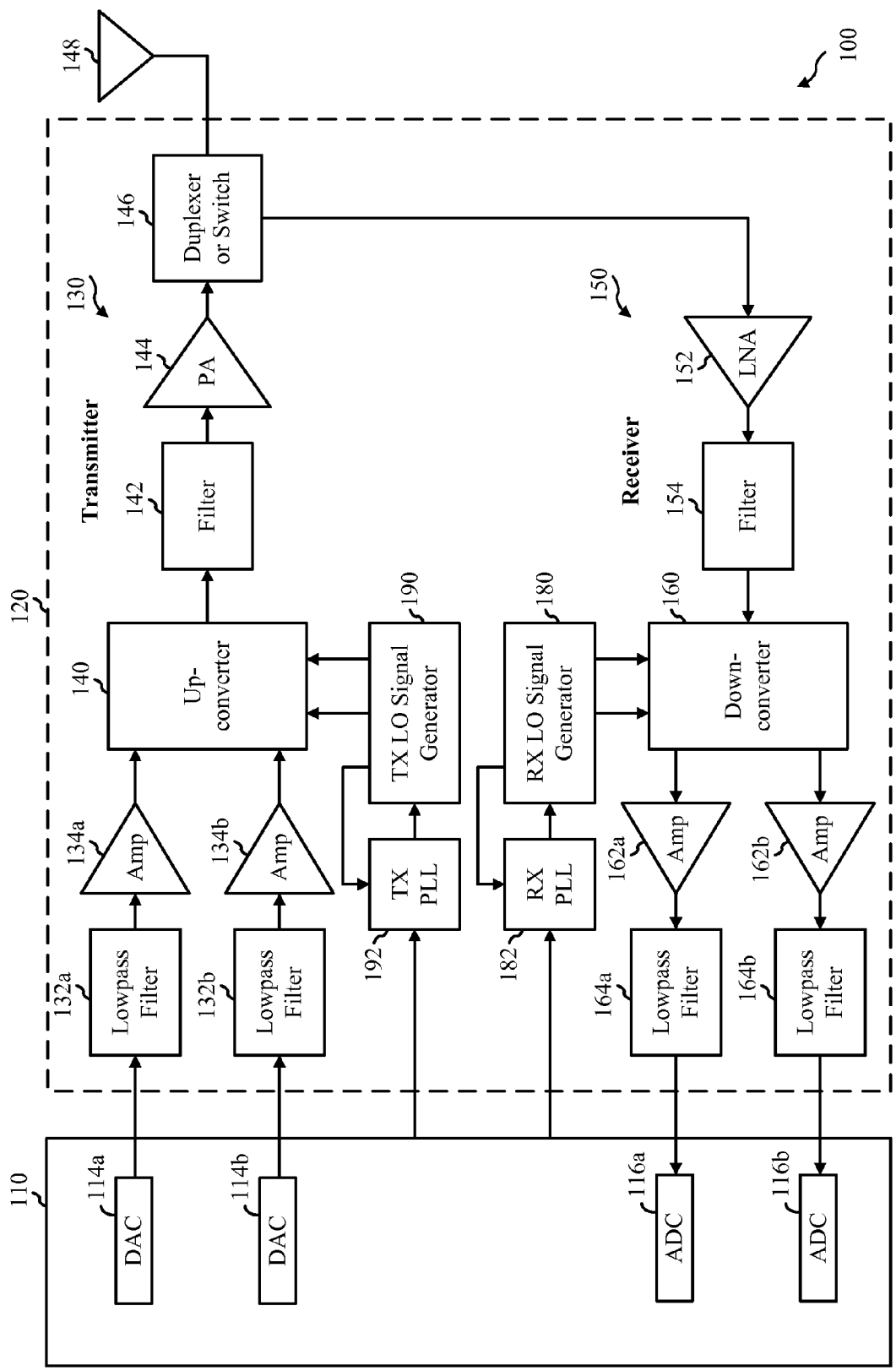
FIG. 1 illustrates a block diagram of a design of a wireless communication device in which the techniques of the present disclosure may be implemented.

FIG. 1 illustrates a block diagram of a design of a wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and any number of receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, lowpass filters 132*a* and 132*b* filter the I and Q analog output signals, respectively, to remove undesired images caused by the prior digital-to-analog conversion. Amplifiers (Amp) 134*a* and 134*b* amplify the signals from lowpass filters 132*a* and 132*b*, respectively, and provide I and Q baseband signals. An upconverter 140 upconverts the I and Q baseband signals with I and Q transmit (TX) local oscillating (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148. In an exemplary embodiment, the power amplifier 144 may be implemented using the multi-cascode amplifier circuit design techniques further described hereinbelow.

In the receive path, antenna 148 receives signals transmitted by base stations and provides a received RF signal, which is routed through duplexer or switch 146 and provided to a low noise amplifier (LNA) 152. The received RF signal is amplified by LNA 152 and filtered by a filter 154 to obtain a desirable RF input signal. A downconverter 160 downconverts the RF input signal with I and Q receive (RX) LO signals from an RX LO signal generator 180 and provides I and Q baseband signals. The I and Q baseband signals are amplified by amplifiers 162*a* and 162*b* and further filtered by lowpass filters 164*a* and 164*b* to obtain I and Q analog input signals, which are provided to data processor 110. In the exemplary embodiment shown, the data processor 110 includes analog-to-digital-converters (ADC's) 116*a* and 116*b* for converting the analog input signals into digital signals to be further processed by the data processor 110.

TX LO signal generator 190 generates the I and Q TX LO signals used for frequency upconversion. RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

Figure 2:
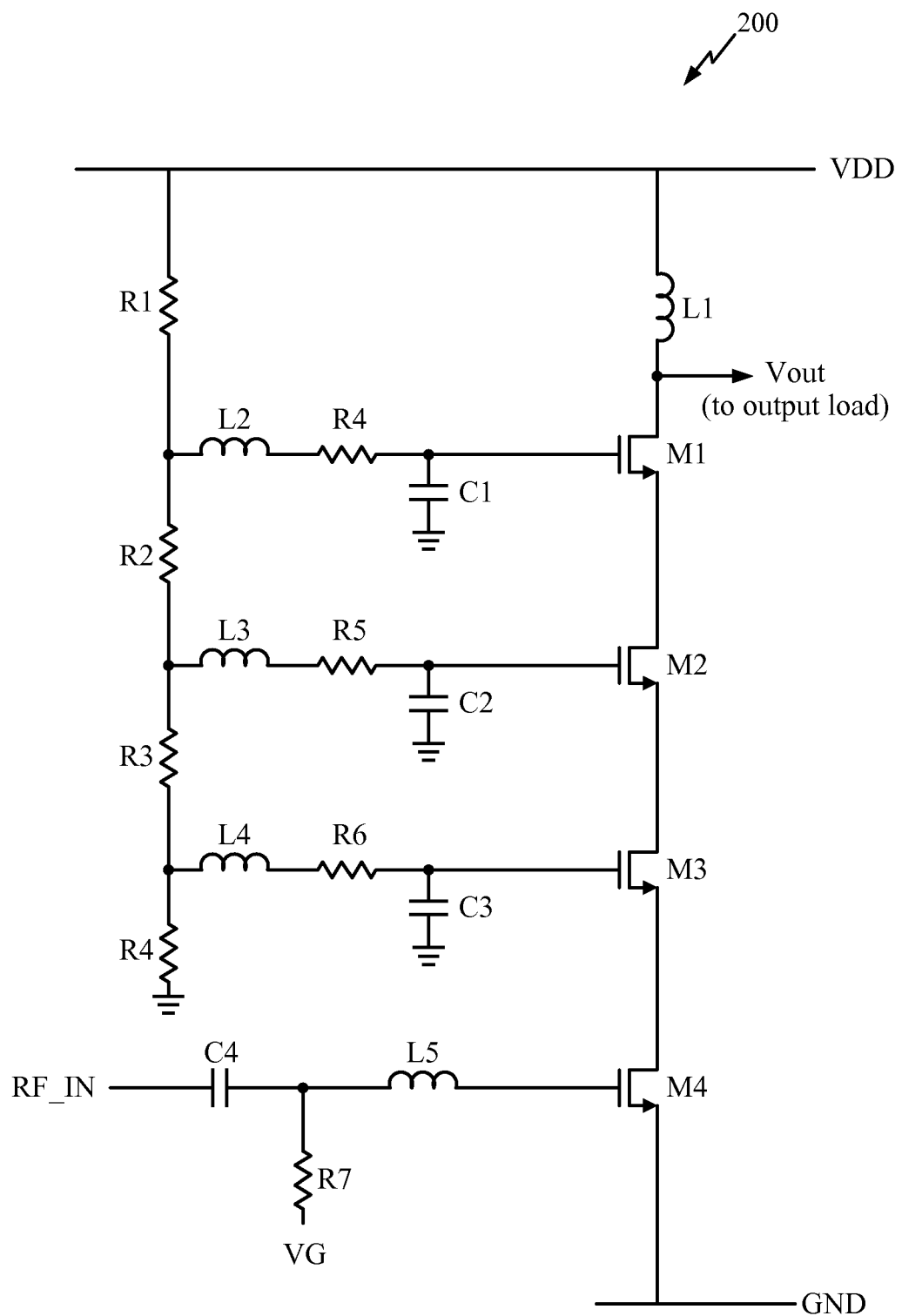
FIG. 2 illustrates a prior art implementation of a multi-cascode amplifier.

FIG. 2 illustrates a prior art implementation 200 of a multi-cascode amplifier. In FIG. 2, an input NMOS transistor M4 is biased by a voltage VG through resistor R7 and inductor L5. The gate of M4 is further coupled via coupling capacitor C4 to an RF input signal RF_IN.

The drain of transistor M4 is coupled to an output voltage Vout via multiple cascode transistors M3, M2, and M1, and an inductor L1 is coupled to the output of the multi-cascode circuit. A resistive network including series-coupled resistors R1, R2, R3, and R4 is provided from a first supply voltage (VDD) to ground to generate a plurality of bias voltages for transistors M1, M2, and M3. In particular, the connection between R1 and R2 is tapped and coupled to the gate of M1 via inductor L2 and resistor R4, with a capacitor C1 further coupling the gate of M1 to ground. Similarly, the connection between R2 and R3 is tapped and coupled to the gate of M2 via inductor L3, resistor R5, and ground-coupled capacitor C2, and the connection between R3 and R4 is tapped and coupled to the gate of M3 via inductor L4, resistor R6, and ground-coupled capacitor C3. In general, the bias voltage VG for the input transistor M1 may be generated using a biasing network separate from the resistive network R1, R2, R3, R4, e.g., to avoid any undesirable coupling and/or feedback which may in turn cause unwanted oscillation in the circuit.

During operation, the RF input signal RF_IN is amplified by the multi-cascode configuration of transistors M1, M2, M3, M4 to generate an amplified output voltage Vout at the drain of M1, which is further coupled to an output load (not shown). A characteristic of the multi-cascode amplifier 200 is that generation of the gate bias voltages for transistors M1, M2, M3 using the resistive dividers R1, R2, R3, R4 is separate from generation of the bias voltage VG for transistor M4. In general, this may lead to inaccuracies in the bias current through M4, as the drain-to-source voltage (VDS) of M4 may not closely corresponding to the VDS of a transistor used for its bias generation. Given large current multiplication ratios between the bias transistor and M4, such inaccuracies in the bias current may be significant.

It will further be appreciated that the biasing of transistor M4 may be problematic in deep sub-micron CMOS processes, due to the potential inaccuracies of providing current mirrors having large mirroring ratios. A further characteristic of the configuration 200 is that since VG may be generated using a biasing network separate from the resistive network R1, R2, R3, R4, variations in the amplifier power supply voltage VDD may have different impacts on the bias voltages for cascode transistors M1, M2, M3 than on the bias voltage for transistor M4.

In light of these considerations, it would be desirable to provide improved and more accurate techniques for biasing a multi-cascode circuit.

Figure 3:
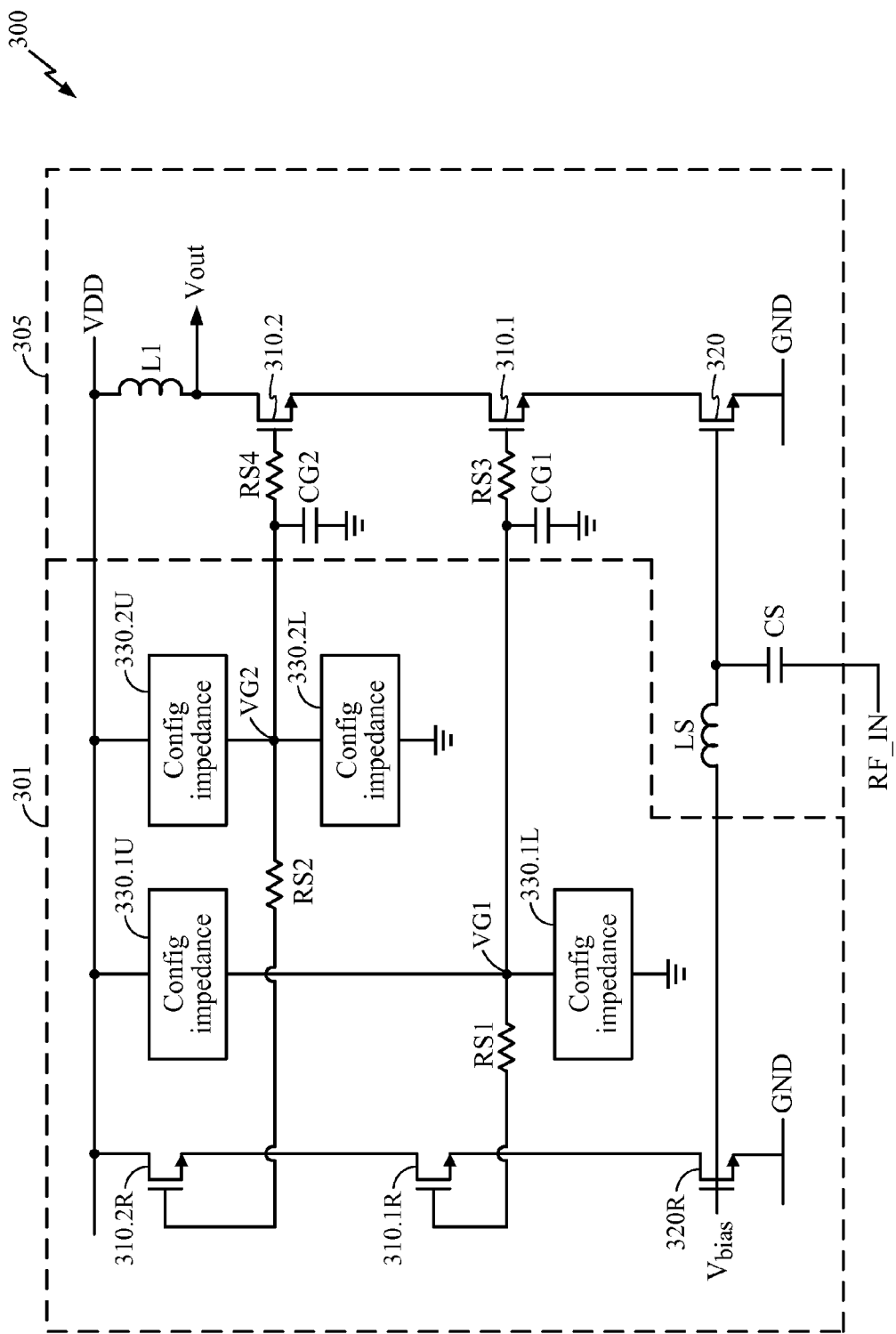
FIG. 3 illustrates an exemplary embodiment according to the present disclosure.

FIG. 3 illustrates an exemplary embodiment 300 according to the present disclosure. Note FIG. 3 is shown for illustrative purposes only, and is not meant to limit the scope of the present disclosure to any particular exemplary embodiment shown. For example, while the exemplary embodiment of FIG. 3 shows two cascode transistors 310.1, 310.2 (alternatively denoted as the "first" and "second" cascode transistors, respectively), alternative exemplary embodiments may readily accommodate fewer or more than two cascode transistors, and such alternative exemplary embodiments utilizing any of the techniques described herein are contemplated to be within the scope of the present disclosure.

In FIG. 3, bias circuitry 301 generates a plurality of bias voltages for biasing transistors 310.2, 310.1 (or the "cascode transistors") and transistor 320 (or the "input transistor") of the multi-cascode amplifier 305. In particular, a set of replica transistors, including transistors 310.1R, 310.2R (or the "cascode bias transistors") and 320R (or the "input bias transistor"), are coupled in series from VDD to ground. In an exemplary embodiment, the replica transistors 310.1R, 310.2R, and 320R may be designed to replicate the configuration and certain physical characteristics of transistors 310.2, 310.1, and 320, respectively, of the multi-cascode amplifier 305. For example, transistors 310.1R, 310.2R, and 320R of the bias circuitry 301 are themselves coupled in multi-cascode configuration. Furthermore, the physical dimensions and layout of transistors 310.2R, 310.1R, and 320R may be designed to match (e.g., to a fixed current ratio) those same parameters of the corresponding transistors 310.1, 310.2, and 320. In this manner, the bias currents and voltages of transistors 310.1, 310.2, and 320 are expected to closely match (e.g., to a fixed ratio) the currents through the replica transistors 310.1R, and 310.2R, and 320R. Note that the close matching is expected at least in part due to the VDS of 320R tracking that of 320, using the replica configuration. In the exemplary embodiment shown in FIG. 3, a voltage Vbias is provided to bias the transistor 320R, and Vbias is further coupled to the gate of transistor 320 via inductor LS.

Further shown in FIG. 3 are configurable impedance blocks 330.1U and 330.1L (or the "first impedance network") for establishing a bias voltage at the gates of transistors 310.1R and 310.1. Note the blocks 330.1U and 330.1L are coupled in series from VDD to ground, and hence, by series voltage division, their relative impedances will determine the actual voltage VG1 at the node connecting 330.1U with 330.1L. For example, if the impedance of 330.1U is 100 kiloOhms, and the impedance of 330.1L is 300 kiloOhms, then the voltage VG1 will correspond to ¾ VDD. Furthermore, if the impedance of either of blocks 330.1U or 330.1L is made configurable as shown, e.g., in response to a control signal, then the voltage VG1 may in turn be adjustable due to the voltage division of VDD by the variable resistances of blocks 330.1U and 330.1L.

It will be appreciated that, as the voltage (or power) gain of the amplifier 305 will be at least partly dependent on the bias voltage VG1 applied to the cascode transistor 310.1, designing the impedance of blocks 330.1U, 330.1L to be configurable allows for adjustment of the overall amplifier gain. One advantage of utilizing the configurable impedance blocks 330.1U, 330.1L to adjust the gain of amplifier 305 is that, as the adjustment of VG1 is performed away from the main signal path, less noise (e.g., noise associated with switching and/or attenuation elements), along with less Zin (input impedance) and Zout (output impedance) variation, will be present at the output voltage Vout, in comparison with implementations wherein gain adjustment elements are provided directly in series with the main signal path.

In FIG. 3, configurable impedance blocks 330.2U and 330.2L (or the "second impedance network") are further provided to adjust the bias voltage VG2 provided to transistors 310.2R and 310.2, according to principles similar to those described hereinabove for transistors 310.1R and 310.1. One of ordinary skill in the art will appreciate that, in alternative exemplary embodiments, not all of the blocks 330.1U, 330.1L, 330.2U, and 330.2L need be provided with the feature of configurable impedance, and any or all of the blocks may be provided with a fixed impedance as may suit any particular design. Furthermore, it will be appreciated that the configurable impedance techniques described herein may be modified to accommodate any number of cascode transistors (e.g., more than two) as necessary in alternative exemplary embodiments, and such alternative exemplary embodiments are contemplated to be within the scope of the present disclosure.

Figure 4:
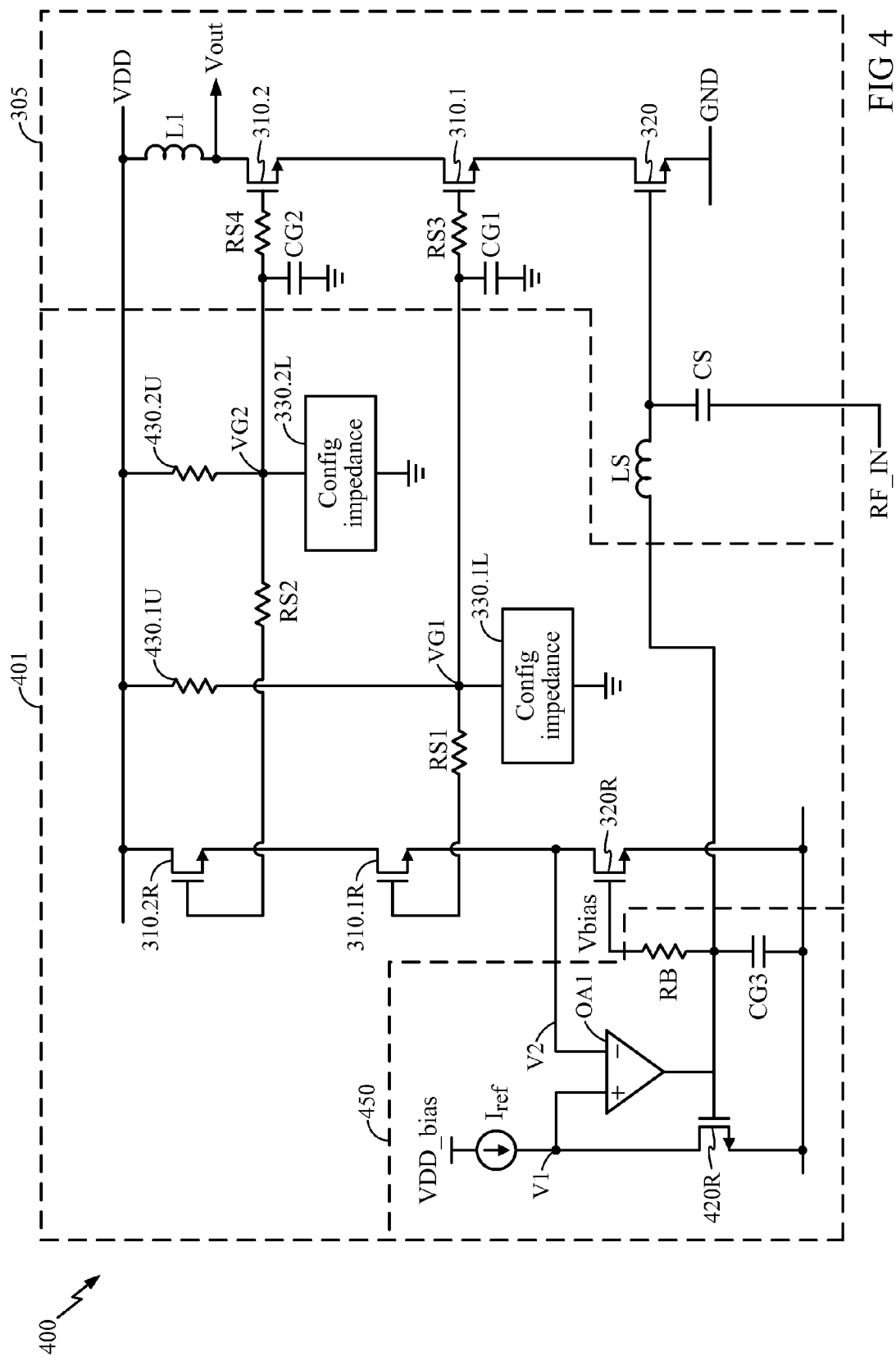
FIG. 4 illustrates a further exemplary embodiment of the present disclosure.

FIG. 4 illustrates a further exemplary embodiment 400 of the present disclosure. Note similarly labeled elements in FIGS. 3 and 4 may correspond to blocks performing similar functionality, unless otherwise noted. The exemplary embodiment 400 includes bias circuitry 401 and a multi-cascode amplifier 305 as shown.

In FIG. 4, a bias block 450 is provided to generate the bias voltage Vbias for transistors 320R and 320. Block 450 includes a reference current source Iref coupled to a voltage source VDD_bias. The output of Iref is coupled to the drain of transistor 420R, whose gate is coupled to the gate of transistor 320R via resistor RB, and further to the gate of transistor 320 via inductor LS (and/or a resistor RS, not shown in FIG. 3). Note transistor 420R may be designed to be a replica of transistor 320R. A capacitor CG3 further couples the output of OA1 to ground.

It will be appreciated that through the negative feedback configuration of OA1, the voltages at V1 and V2 are designed to be driven equal to each other. In this manner, the current through 320R will be an accurate ratio of Iref. By then coupling the gate voltage Vbias of 320R to the gate of 320, it is expected that the current through transistor 320 of amplifier 305 will also be set accurately by the reference current Iref.

It will be appreciated that, as the input transistor 320 is in the main signal path of the amplifier 305, it would be undesirable to couple the input of OA1 directly to the drain of 320, to minimize any parasitic loading on the transistor 320. Therefore, an advantage of the bias block 450 is that accurate biasing may be achieved by coupling with the replica transistor 320R, without negatively impacting transistor 320 of the main signal path.

In the exemplary embodiment of FIG. 4, the supply voltage VDD_bias of the bias block 450 is preferably decoupled from the supply voltage VDD of the amplifier 305, such that variations in the level of VDD do not affect the level of VDD_bias. For example, VDD and VDD_bias may be generated and provided by separate voltage regulators, and/or they may have different voltage levels. In an exemplary embodiment, VDD_bias may be lower than VDD. It will be appreciated that an advantage of providing separate voltages VDD and VDD_bias is that the effects of any potential parasitic feedback loops in the circuit may be mitigated.

A further aspect of the exemplary embodiment illustrated in FIG. 4 is that resistors 430.1U, 430.2U having fixed resistances are provided to bias the gates of transistors 310.1, 310.2. In this manner, only the lower impedances 330.1L, 330.2L of the resistive dividers are configurable, which is nevertheless sufficient to make the bias voltages VG1, VG2 configurable.

Figure 5:
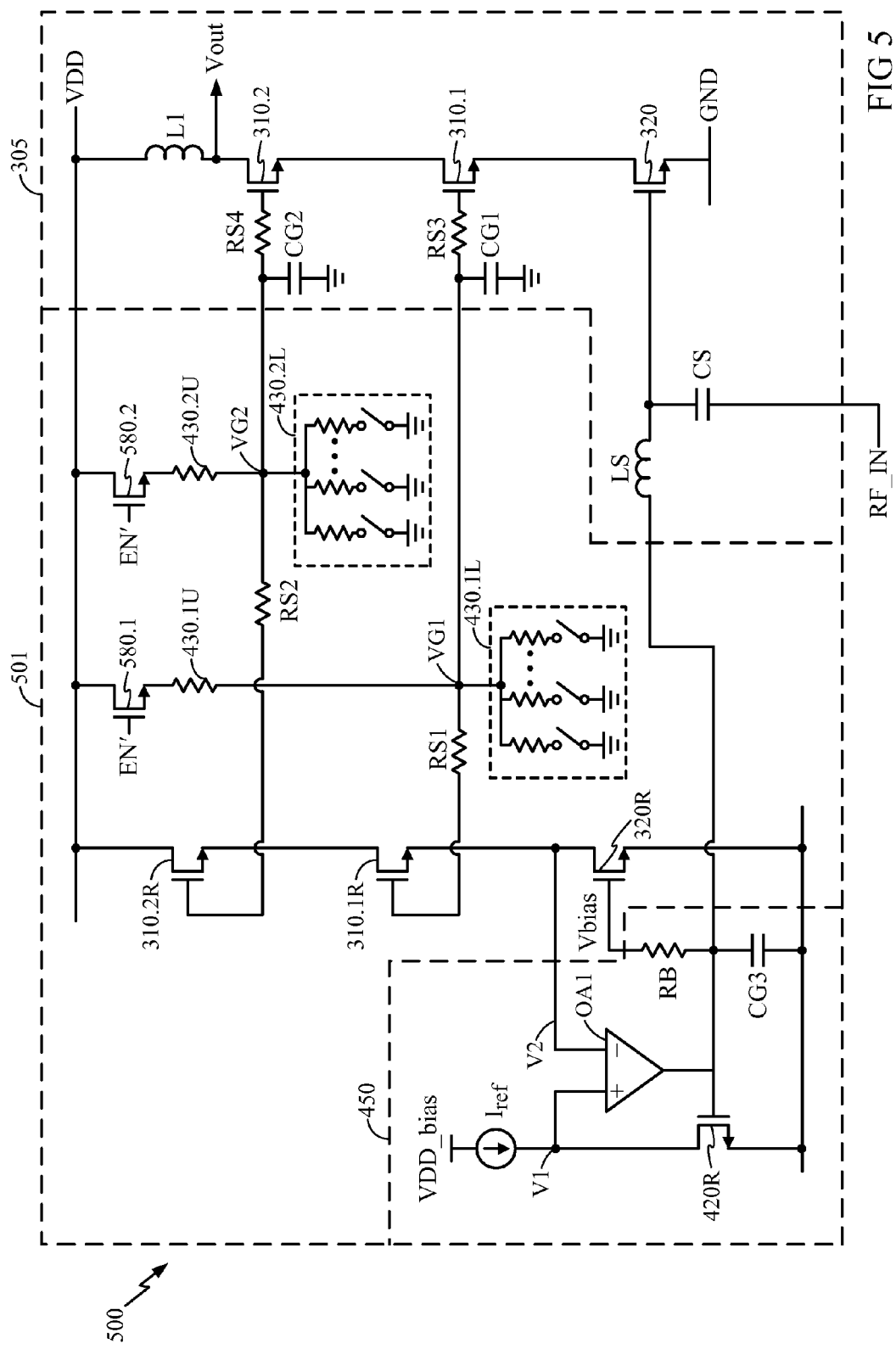
FIG. 5 illustrates an alternative exemplary embodiment of the present disclosure incorporating additional features.

FIG. 5 illustrates an alternative exemplary embodiment 500 of the present disclosure incorporating additional features according to the present disclosure. Note similarly labeled elements in FIGS. 4 and 5 may correspond to blocks performing similar functionality, unless otherwise noted. The exemplary embodiment 500 includes bias circuitry 501 and a multi-cascode amplifier 305 as shown.

In FIG. 5, two PMOS transistors 580.1 and 580.2 (or the "power-down switches") are coupled in series with resistors 430.1U and 430.2U, respectively, of the resistive dividers biasing transistors 310.1 and 310.2, respectively. By configuring an enable control signal EN' coupled to the gates of transistors PMOS 580.1, 580.2, the bias voltages to transistors 310.1, 310.2 may be selectively turned on or off, thereby selectively enabling or disabling the multi-cascode amplifier.

FIG. 5 further illustrates an exemplary embodiment of the lower configurable impedances 330.1L, 330.2L from FIGS. 3 and 4 as banks of parallel switchable resistors 430.1L, 430.2L (or a "switchable resistance network"). By selectively opening and closing switches within the resistor banks 430.1L, 430.2L, it will be appreciated that the net resistance of each bank may be configured, and thus the bias voltages VG1, VG2 to transistors 310.1, 310.2 may be adjusted. It will be appreciated that the configurations of the switches may be directly controlled using digital logic. In an exemplary embodiment, the drain-to-source voltage (VDS) of either the cascode transistor 310.1 or transistor 320 may be reduced from saturation to a linear regime of operation to significantly reduce the amplifier gain.

For example, since VG1=VGS (transistor 310.1)+VDS (transistor 320) as shown in FIG. 4, it will be appreciated that reducing VG1 will also reduce VDS (transistor 320), given that VGS (transistor 310.1) is fixed due to constant current. Similarly, since VG2=VGS (transistor 310.2)+VDS (transistor 310.1)+VDS (transistor 320), reducing VG2 will similarly reduce VDS (transistor 310.1)+VDS (transistor 320), given that VGS (transistor 310.2) is fixed due to constant current. In this manner, varying VG1 and VG2 using the configurable impedance techniques of the present disclosure advantageously allows adjustment of the VDS of transistor 310.1 or 320 to in turn adjust the amplifier gain.

Figure 6:
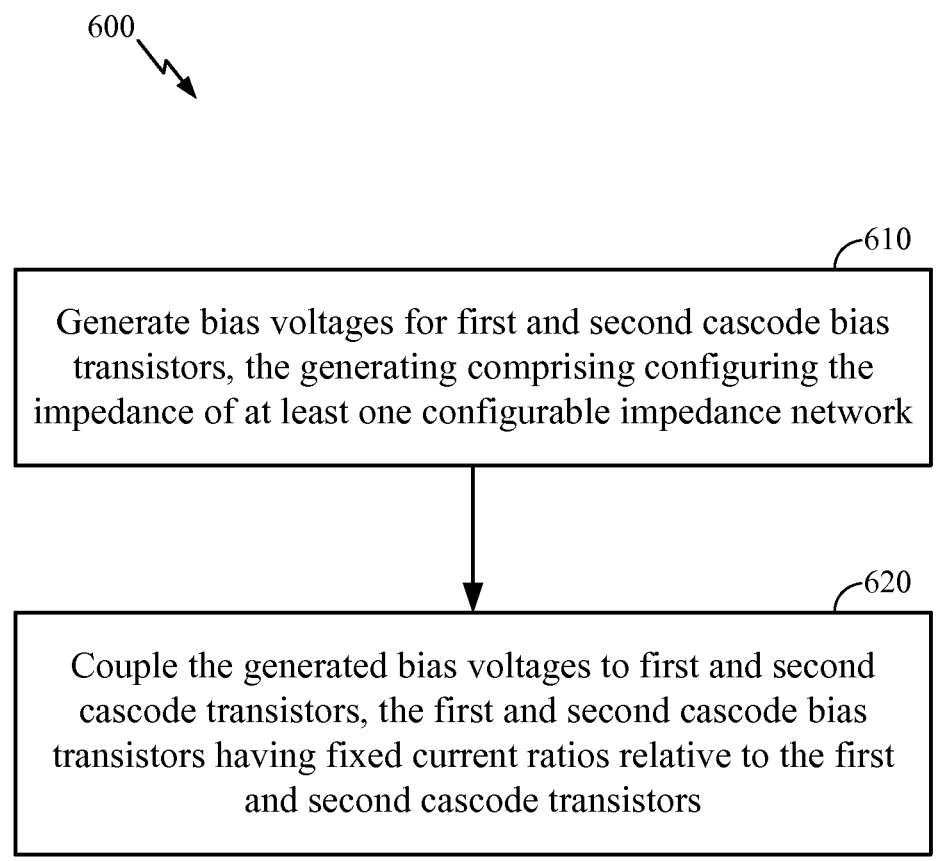
FIG. 6 illustrates an exemplary embodiment of a method according to the present disclosure.

FIG. 6 illustrates an exemplary embodiment of a method according to the present disclosure. Note the method of FIG. 6 is shown for illustrative purposes only, and is not meant to limit the scope of the present disclosure to any particular method shown.

In FIG. 6, at block 610, bias voltages for first and second cascode bias transistors are generated. The generating may comprise configuring the impedance of at least one configurable impedance network coupled to a first supply voltage to vary the voltage tapped from an impedance divider network.

At block 620, the generated bias voltages are coupled to first and second cascode transistors. The first and second cascode bias transistors may have fixed current ratios relative to the first and second cascode transistors. In an exemplary embodiment, the first and second cascode bias transistors may be replicas of the first and second cascode transistors.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
   multi-cascode bias transistors comprising first and second cascode bias transistors and an input bias transistor, the input bias transistor comprising a drain coupled to the source of the first cascode bias transistor; and first and second impedance networks coupled to a first supply voltage for generating bias voltages for the first and second cascode bias transistors, respectively, at least one of the first and second impedance networks comprising a configurable impedance for adjusting at least one bias voltage for the first and second cascode bias transistors;

wherein the input bias transistor is biased to a gate voltage determined by a reference current through a transistor that is a replica of the input bias transistor.

2. The apparatus of claim 1, at least one configurable impedance comprising:

a switchable resistance network configured to adjust the resistance coupling the gate of the respective cascode bias transistor to ground.

3. The apparatus of claim 1, at least one configurable impedance comprising:

a switchable resistance network configured to adjust the resistance coupling the gate of the respective cascode bias transistor to a supply voltage.

4. The apparatus of claim 1, the multi-cascode bias transistors further comprising a third cascode bias transistor, the gate of the third cascode bias transistor being coupled to a configurable impedance network.

5. The apparatus of claim 1, further comprising at least one power-down switch selectively decoupling at least one of the impedance networks from the first supply voltage.

6. The apparatus of claim 1, the second cascode bias transistor comprising a drain directly coupled to the first supply voltage.

7. An apparatus comprising:

multi-cascode bias transistors comprising first and second cascode bias transistors and an input bias transistor, the input bias transistor comprising a drain coupled to the source of the first cascode bias transistor; and a multi-cascode amplifier comprising:

a first cascode transistor comprising a gate coupled to the bias voltage of the first cascode bias transistor; and a second cascode transistor comprising a gate coupled to the bias voltage of the second cascode bias transistor; and an input transistor coupled to the source of the first cascode transistor, the input transistor comprising a gate coupled to the gate voltage of the input bias transistor.

8. The apparatus of claim 7, the multi-cascode amplifier coupled to a first supply voltage, and a reference current through a transistor that is a replica of the input bias transistor coupled to a second supply voltage separate from the first supply voltage.

9. The apparatus of claim 8, the second supply voltage being lower than the first supply voltage.

10. The apparatus of claim 7, the apparatus configurable to reduce at least one bias voltage for the first and second cascode bias transistors to reduce a gain of the multi-cascode amplifier.

11. The apparatus of claim 7, each of the multi-cascode bias transistors being configured to have a fixed current ratio relative to a corresponding transistor of the multi-cascode amplifier.

12. The apparatus of claim 7, further comprising:

first and second impedance networks coupled to a first supply voltage for generating bias voltages for the first and second cascode bias transistors, respectively, at least one of the first and second impedance networks comprising a configurable impedance for adjusting at least one bias voltage for the first and second cascode bias transistors.

13. An apparatus comprising:

multi-cascode bias transistors comprising first and second cascode bias transistors and an input bias transistor, the input bias transistor comprising a drain coupled to the source of the first cascode bias transistor; and means for adjusting the bias voltage of at least one of the multi-cascode bias transistors by configuring a configurable impedance;

means for selectively decoupling at least one configurable impedance network from a first supply voltage.

14. The apparatus of claim 13, the means for adjusting the bias voltage comprising a switchable resistance network, the network comprising a plurality of switches, each switch coupled in series with a corresponding resistor, the plurality of series-coupled switches and resistors in turn coupled to each other in parallel.

15. The apparatus of claim 14, further comprising:

means for biasing the input bias transistor.

16. The apparatus of claim 13, further comprising:

means for generating a bias voltage for a third cascode bias transistor by configuring the impedance of a configurable resistance network.

17. A method comprising:

generating bias voltages for first and second cascode bias transistors, the generating comprising configuring the impedance of at least one configurable impedance network coupled to a first supply voltage to vary the voltage tapped from an impedance divider network; and coupling the generated bias voltages to first and second cascode transistors, the first and second cascode bias transistors having fixed current ratios relative to the first and second cascode transistors, the source of the first cascode bias transistor coupled to the drain of an input bias transistor, the source of the first cascode transistor coupled to the drain of an input transistor;

wherein the input bias transistor is biased to a gate voltage determined by a reference current through a transistor that is a replica of the input bias transistor.

18. The method of claim 17, further comprising:

coupling the first supply voltage to the first and second cascode transistors; and coupling a second supply voltage separate from the first supply voltage to a reference current used to bias the input bias transistor.

19. The method of claim 17, further comprising:

adjusting the gain of a variable-gain amplifier by configuring the impedance of the at least one configurable impedance.

* * * * *